US006501805B1

(12) United States Patent
Twitchell

(10) Patent No.: US 6,501,805 B1
(45) Date of Patent: *Dec. 31, 2002

(54) BROADCAST TRANSMISSION SYSTEM WITH SINGLE CORRECTION FILTER FOR CORRECTING LINEAR AND NON-LINEAR DISTORTION

(75) Inventor: Edwin Ray Twitchell, San Jose, CA (US)

(73) Assignee: Harris Corporation, Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/312,353

(22) Filed: May 14, 1999

(51) Int. Cl.$^7$ .............................................. H04B 15/00
(52) U.S. Cl. ...................... 375/285; 330/149; 332/159
(58) Field of Search ................................. 375/285, 284, 375/296, 297, 295; 330/149; 332/159, 160, 162, 124

(56) References Cited

U.S. PATENT DOCUMENTS

| 4,870,371 A | 9/1989 | Gottwald et al. ........... 330/149 |
| 4,993,047 A | 2/1991 | Moffatt et al. ............... 375/261 |
| 5,339,054 A * | 8/1994 | Taguchi ....................... 332/100 |
| 5,486,789 A | 1/1996 | Palandech et al. ........... 330/149 |
| 5,778,153 A | 7/1998 | Wang .......................... 706/26 |
| 5,900,778 A | 5/1999 | Stonick et al. .............. 330/149 |
| 6,335,767 B1 * | 1/2002 | Twitchell et al. ........... 348/608 |

FOREIGN PATENT DOCUMENTS

EP          0121446 A1    10/1984    ............. H03F/1/32

* cited by examiner

Primary Examiner—Mohammad H. Ghayour
(74) Attorney, Agent, or Firm—Tarolli, Sundheim, Covell, Tummino & Szabo L.L.P.

(57) ABSTRACT

In a digital broadcast transmission system (60), a power amplifier (66) amplifies an information signal to a power level suitable to excite an antenna to emit a broadcast signal. Prior to, an subsequent to, the amplification processing circuitry (68, 70) processes the signal. In particular, the information signal is bandpass filtered. The power amplifier (66) causes non-linear distortion to the information signal. The processing circuitry (68, 70) causes linear distortions to the information signal. A single, memoryful filter (76) pre-distorts the information signal to compensate for all of the linear and non-linear distortions. Preferably, the memoryful filter (76) is a volterra filter. In another embodiment, a memoryful filter (112) pre-distorts an information signal to compensate for linear distortion from a power amplifier (102) and non-linear distortion from pre-amplification processing circuitry (104). Linear distortion from post-amplification processing circuitry is compensated by a linear equalizer (114). For each embodiment, the number of compensation steps is reduced compared to a sequence in which separate compensation occurs.

11 Claims, 3 Drawing Sheets

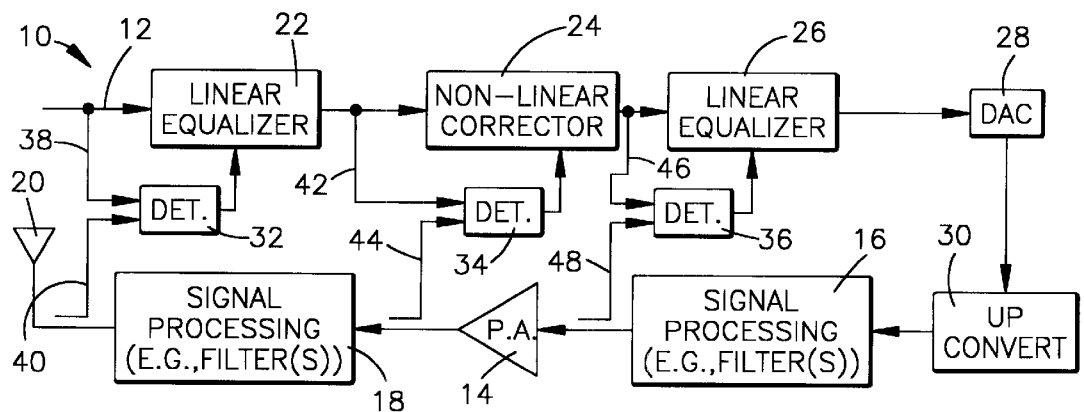
Fig.1 (BACKGROUND)
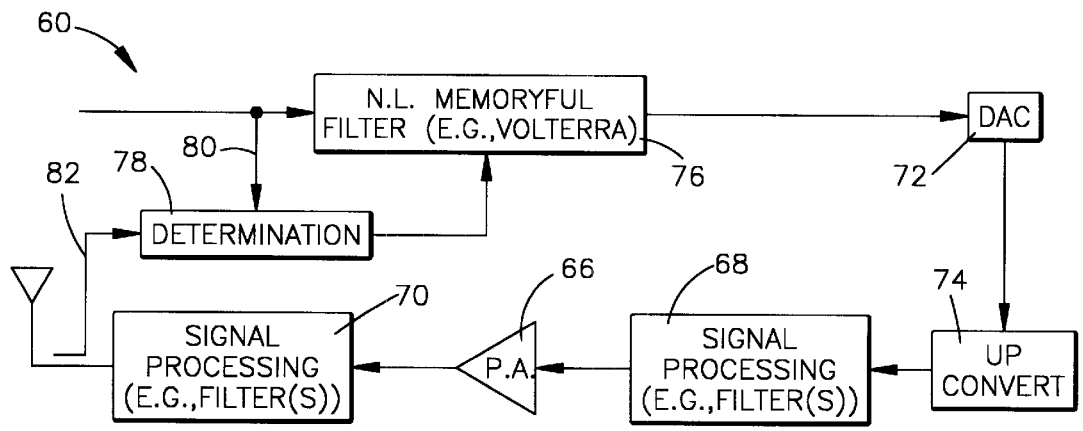
Fig.2
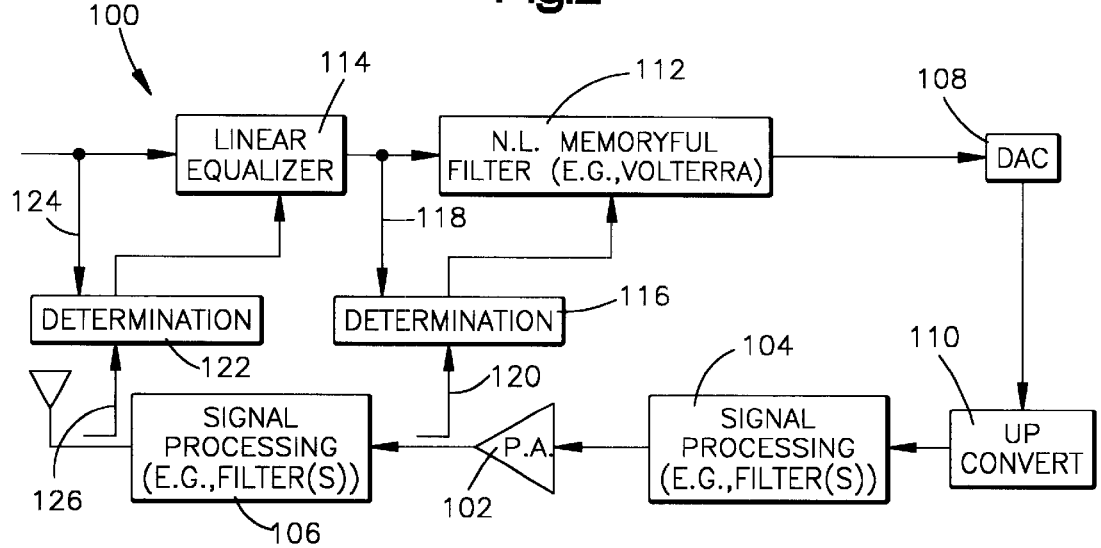
Fig.5

BROADCAST TRANSMISSION SYSTEM WITH SINGLE CORRECTION FILTER FOR CORRECTING LINEAR AND NON-LINEAR DISTORTION

TECHNICAL FIELD

The present invention relates to broadcast transmission systems and is particularly directed to compensation of distortion within a digital transmission system, such as a digital TV ("DTV") transmission system.

BACKGROUND OF THE INVENTION

A high-speed broadcast transmission system such as a DTV broadcast system includes components that distort an information signal away from intended values. Specifically, the system includes a power amplifier that imposes non-linear distortion upon the signal, as a signal is amplified. Also, the broadcast transmission system includes filters, such as band-limiting filters, that impose linear distortion upon the information signal as the signal is filtered.

As a result of such distortions within the transmission system, instantaneous amplitude variations (AM/AM) and instantaneous phase variations (AM/PM) occur. In addition, frequency dependent amplitude and phase variations occur. It is to be appreciated that within a phase-amplitude modulated system, integrity of amplitude and phase must be preserved for optimum system performance.

There is a need for a high-speed technique for adaptive correction of linear an non-linear distortion within a digital broadcast transmission system.

SUMMARY OF THE INVENTION

In accordance with one aspect, the present invention provides a digital broadcast transmission system. The system includes a signal provision means for providing an electrical information-conveying signal. Antenna means emits a broadcast signal that contains the contents of the information signal. Amplifier means amplifies the information signal to a power level suitable to excite the antenna means to emit the broadcast signal. The amplifier means causes non-linear distortion to the information signal. Signal processing means processes the information signal. The signal processing means causes linear distortion to the information signal. A single filter pre-distorts the information signal to compensate for the linear and non-linear distortions.

In accordance with another aspect, the present invention provides a digital broadcast system that includes signal provision means or providing an electrical information-conveying signal along a signal stream. Antenna means, located the end of the signal stream, emits a broadcast signal that conveys the contents of the information signal. A plurality of components is located along the signal stream between the signal provision means and the antenna means. The plurality of components causes distortion to the information signal. At least one of the plurality of components causes linear distortion to the information signal and at least one of the plurality of components causes non-linear distortion to the information signal. A single filter pre-distorts the information signal to compensate for all of the distortion caused by the plurality of components.

BRIEF DESCRIPTION OF THE DRAWINGS

The foregoing and other features of the present invention will become apparent to those skilled in the art to which the present invention relates upon reading the following description with reference to the accompanying drawings, wherein:

FIG. 1 is a function block diagram of components of a portion of a transmission system configured to provide one approach to distortion correction;

FIG. 2 is a function block diagram of components of a portion of a transmission system configured to provide distortion correction in accordance with the present invention;

FIG. 5 is a diagram similar to FIG. 2, but shows another example of system components configured to provide distortion correction in accordance with the present invention.

DESCRIPTION OF PREFERRED EMBODIMENTS

Figure 3:
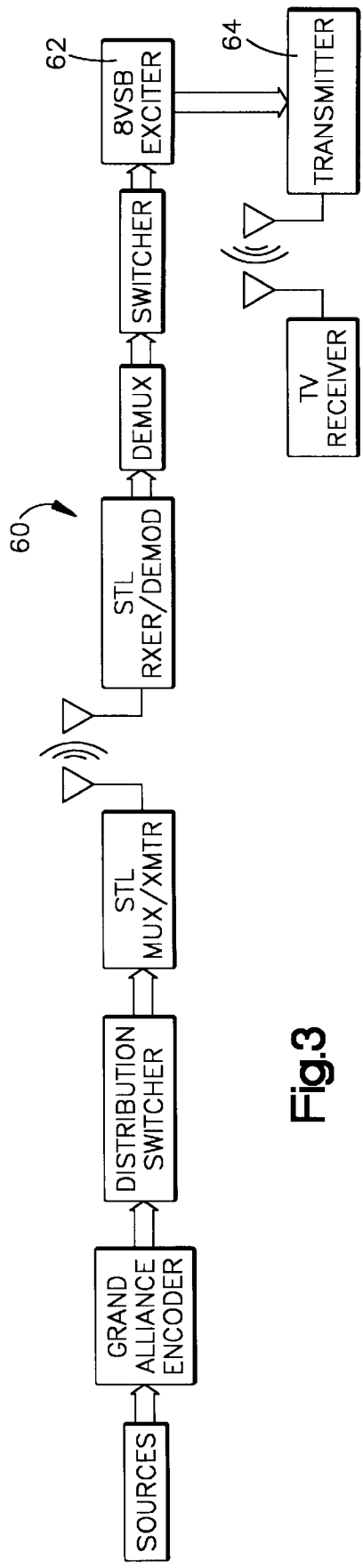
FIG. 3 is the transmission system that includes the structure of FIG. 2.

FIG. 1 is a function block diagram of components of a portion of a digital broadcast transmission system 10 that employs one technique of Correction for linear and non-linear distortion. The present invention is an improvement over the correction technique of FIG. 1. A discussion of the technique employed within the system 10 of FIG. 1 will be helpful to understand the present invention.

In FIG. 1, a plurality of components of the system 10 is located sequentially along a data stream path 12. The data stream is for an information data signal that is transmitted at a relatively high rate. Further, the data signal typically has a relatively wide band (i.e., 18 MHz).

The high data rate and bandwidth are related to the type/environment of the system 10. Specifically, the system 10 is a high definition ("HD") digital television ("DTV") system. The system 10 includes a power amplifier 14, pre-amp signal processing circuitry (i.e., filters and/or the like) 1 , and post-amp signal processing circuitry (i.e., filters and/or the like) 18. The power amplifier 14 and the processing circuitry 16, 18 operate in analog format and at a frequency suitable for radio broadcast transmission from an antenna 20. For example, the broadcast signal output from the antenna 20 is at amplification power level of 50 kilowatts and is in the ultrahigh frequency range (300–3000 MHz), and is preferably in the range of 470–860 MHz.

The power amplifier 14 may De comprised of an array of amplifying devices. If a plurality of amplifying devices is present, the power amplifier 14 includes a suitable combiner device. The processing circuitry 16, 18 include such components as bandpass filters. In particular, the post-amp processing circuitry 18 includes a high-power bandpass filter.

Non-linear distortion is imposed upon the information signal by the power amplifier 14 during amplification of the information signal. Specifically, the non-linear distortion is directed to changes in instantaneous amplitude and phase variations. The is processing circuitry 16, 18, and in particular the bandpass filters of the processing circuitry, impose linear deformation upon the information signal. Thus, in the sequence of the pre-amp processing circuitry 16, the power amplifier 14, and the post-amp processing circuitry 18, a sequence of linear distortion, nonlinear distortion, and linear distortion is imposed upon the information signal as the signal proceeds toward the antenna 20.

In the system 10 of FIG. 1, each of the three distortions (i.e., linear, non-linear, and linear) is corrected or compensated for separately. Specifically, the system 10 includes a first linear equalizer 22 that compensates (i.e., pre-distorts) for the linear distortion caused by the post-amp processing circuitry 18. A non-linear corrector 24 compensates for the non-linear distortion caused by the power amplifier 14. A second linear equalizer 26 compensates for the linear distortion caused by the pre-amp processing circuitry 16.

The three compensating components 22–26 are located sequentially along the data stream 12 of the system 10, and are located upstream of the distortion causing components (i.e., the power amplifier 14 and the processing circuitry 16, 18). The compensating components 22–26 operate in digital format. A digital-to-analog converter (DAC) 28 and an upconverter 30 are located along the signal stream between the group of compensating components 22–26 and the group of distortion causing components 14–18.

Compensation provided by each of the compensating component 22–26 is changeable (i.e., adaptable). Each compensating component 22–26 requires a separate determination in order to accomplish the change of compensation (adaptation of the pre-distortion). Accordingly, three determination function blocks 32–36 are present within the system. The first determination function block 32 determines the pre-distortion that is to be provided by the first linear equalizer 22. The first determination function block 32 is operatively coupled to receive the input 38 or the first linear equalizer 22 and to receive the output 40 of the post-amp processing circuitry 18.

The second determination function block 34 determines the pre-distortion that is to be provided by the non-linear corrector 24. The second determination function block 34 is operatively coupled to receive the input 42 of the non-linear corrector 24 and to receive the output 44 of the power amplifier 14. The third determination function block 36 determines the pre-distortion that is to be provide by the second linear equalizer 26. The third determination function block 36 is operatively coupled to receive the input 46 of the second linear equalizer 26 and to receive the output 48 of the pre-amp processing circuitry 16.

It is to be appreciated that three separate compensation "steps" are present. Further, it is to be appreciated that each step of compensation requires sampling signal values, determining needed adaptation, and applying the determined adaptation. Associated with each compensation "step" is a need for appropriate processing capability, memory storage capability, and the like.

The function block diagram of FIG. 2 shows details of a portion of a system 60 that incorporates the present invention. An overview of the complete system 60 is shown in FIG. 3. The components shown in FIG. 2 are located within an 8VSB exciter 62 and transmitter 64 of the system 60 shown within FIG. 3.

The components shown in FIG. 2 include a power amplifier 66, pre-amp signal processing circuitry 68, post-amp signal processing circuitry 70, a DAC 72, and an upconverter 74. In one example, the components 66–74 of the system 60 of FIG. 2 are identical to the corresponding components 14–18, 28 and 30 of the system 10 of FIG. 1.

In distinction from the system 10 of FIG. 1, the system 60 of FIG. 2 includes a non-linear memoryful filter 76 instead of the sequence of the first linear equalizer 22 (FIG. 1), the non-linear corrector 24, and the linear equalizer 26. Preferably, the non-linear memoryful filter 76 is a volterra filter. The single volterra filter 76 is an adaptive filter that corrects for both linear and non-linear distortion of the downstream components (i.e., the power amplifier 66 and the processing circuitry 68, 70). The volterra filter 76 is modeled by a polynomial.

In order to determine adaptation, a determination function block 78 is operatively connected to receive the input 80 of the volterra filter 76 and the output 82 of the post-amp processing circuitry 70. Accordingly, it is to be appreciated that only a single compensation "step" is present. Further, it is to be appreciated that within the single "step" of compensation, only one group of sampling signal values is needed, only one determination regarding adaptation is needed, and only one application of the determined adaptation is needed.

It is to be appreciated that the system 60 may have various types of components, such as solid-state, tube, etc. The volterra filter 7 can be configured to operate within any of such variation of the system 60. Accordingly, the present invention is not limited to any one volterra filter configuration.

Figure 4:
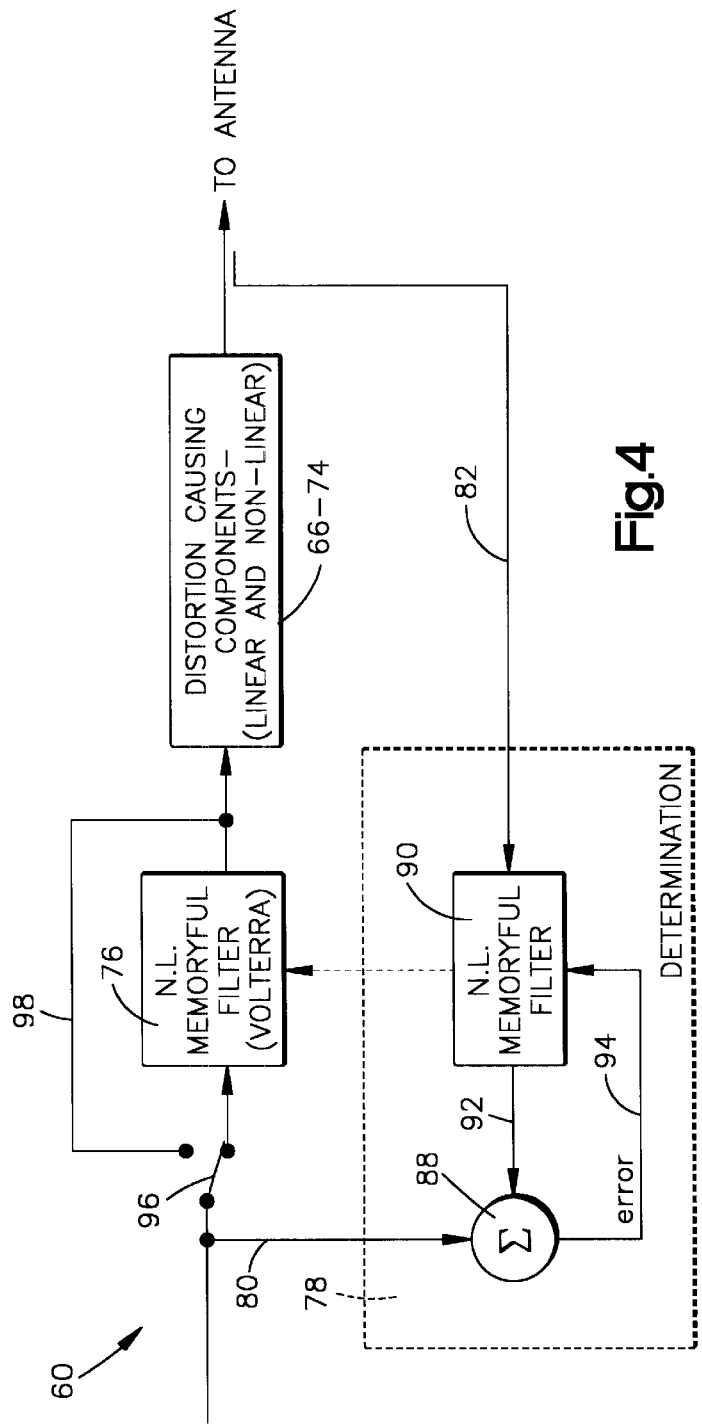
FIG. 4 is a diagram illustrating a manner in which the structure of FIG. 2 determines and adapts correction.

FIG. 4 is a block diagram that shows the determination of compensation and adaptation of the volterra filter 76. Specifically, within FIG. 4, the distortion causing components (i e., the power amplifier and the processing circuitry) 66–72 are condensed into a single block located downstream of the volterra filter 76. The output 2 from the distortion causing components 66–72 and the input 80 are provided to the determination function block 78. Within the determination function block 78, the input 80 that is provided to the volterra filter 76 is provided as a first input to a comparison circuit 88 (i.e., a SUM circuit having an addition input and a subtraction input).

A non-linear memoryful filter 90 receives the output signal 82 from the distortion causing components and outputs a signal 92 to the comparison circuit 88. An output 94 of the comparison circuit 88 is termed an error signal and is indicative of the amount of distortion (both linear and non-linear) that occurs along the data stream. Thus, the error signal 94 is indicative of the amount of distortion caused by the distortion causing components 66–74. The error signal 94 is provided as an input to the non-linear memoryful filter 90. The non-linear memoryful filter 90 determines an amount of correction necessary to reduce the error signal to zero or effectively zero (i.e., a null condition). Once the prescribed error value is reached, filter coefficients are downloaded to the volterra filter 76.

To initiate the process of Determining the distortion caused by the distort on causing components 66–74, the volterra filter 76 is initially disabled or turned OFF. The "OFF" state of the volterra filter 76 is represented by the switch 96 and bypass line 98 that extends around the volterra filter 76. Accordingly, the output from the distortion causing components 66–72 does not include any pre-distortion imposed by the volterra filter 76, and only includes distortion caused by the distortion causing components. Once the non-linear memoryful filter 90 of the determination function makes an initial determination regarding distortion values, the non-linear memoryful filter 90 is downloaded to the volterra filter 76 and the switch 96 is set such that the volterra filter 76 is no longer by-passed (the volterra filter is turned ON). Additional adaptation requires this sequence to be repeated.

It is to be noted that the use of the switch 96 to initially by-pass the volterra filter 76 may be omitted such that adaptation is initially based upon the use of the volterra filter 76. The advantage of the use of the non-linear memoryful filter 90 (i.e., an off-line approach) is that coefficients can be adapted in groups, and the entire memory space can be used. An in-line compensator approach requires the memory to be reset or loaded again after each volterra kernel update.

Another example of a system 100 in accordance with the present invention is shown in FIG. 5 (only the pertinent portion of the system 100 is shown in FIG. 5). The system 100 of FIG. 5 is similar to the system 60 of FIG. 2. Specifically, the components of the system 100 of FIG. 5 may be part of the overall system shown in FIG. 3. Further the system 100 of FIG. 5 includes the components of a power amplifier 102, pre-amp processing circuitry 104, post-amp processing circuitry 106, a DAC 108, and upconverter 110.

The system 100 of FIG. 5 differs from the system 60 of FIG. 2, in that only the linear distortion of the pre-amp processing circuitry 104 and the non-linear distortion of the power amplifier 102 are corrected within a volterra filter 112 located upstream of the DAC 108. The linear distortion caused by the post-amp processing circuitry 10 is corrected via pre-distortion within a linear equalizer 114 located upstream of the volterra filter 12.

A determination function block 116 for the volterra filter 112 is connected to an input 118 of the volterra filter 112 and is connected to an output 120 of the power amplifier 102. A determination function block 122 for the linear equalizer 114 is operatively connected to the input 124 of the linear equalizer and the output 126 of the post-amp processing circuitry 106. Compared to the system 10 shown in FIG. 1, the system 100 of FIG. 5 includes one less "step" of compensation (i.e., sampling, adaptation determination, and pre-distortion. Specifically, the functions of compensation performed by the non-linear corrector 24 (FIG. 1) and the second linear equalizer 26 of the system 10 of FIG. 1 are performed by the volterra filter 112 (FIG. 5) of the system 100.

The use of the linear equalizer 114 upstream of the volterra filter 112 has certain benefits, especially if the post-amp processing circuitry 106 includes a high-power filter. The high-power filter may be a relatively high order filter. As such, it requires a significant order of volterra filter to compensate for it. In general, the order of a volterra-type filter will increase as the square of the system order. Whereas, a linear equalizer is typically about the same order as the system for which it compensates. Therefore, if the high-power filter is compensated by linear filter means external to the volterra filter, it may reduce system cost by allowing a much lower order volterra filter.

Also, the high-power filter attenuates (eliminates) the high order non-linear information needed for non-linear equalizer compensation. Although the information may still be there, it will be sufficiently attenuated so that very high dynamic ranges would be required of the system to provide equalization. Rather than burden the non-linear equalizer with the difficulties of high dynamic range issues, it is prudent to pick-off the return signal before the high-power filter.

Figure 6:
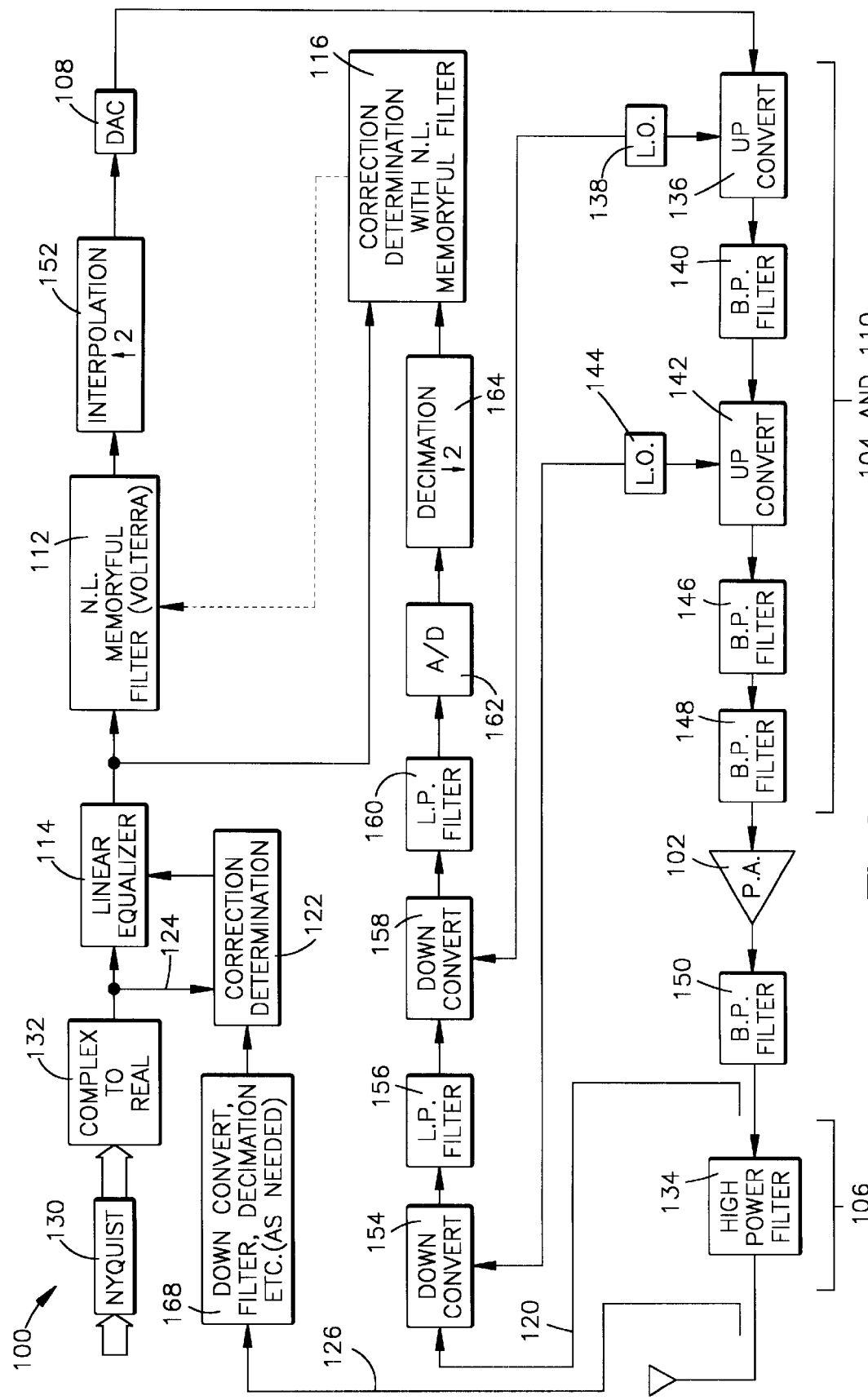
FIG. 6 is an expanded block diagram of components in the system for FIG. 5.

A more detailed representation of the system 100 of FIG. 5 is shown in the function block diagram of FIG. 6. Specifically, a Nyquist filter 130 of the 8VSB exciter provides the information signal in a digital and complex format to a complex-to-real converter 132. The output of the complex-to-real converter 132 is a digital signal in real format that is provided as the input to the linear equalizer 11. The linear equalizer 114 is a digital filter that has suitable structure for pre-compensating or pre-equalizing the information signal to compensate for the linear distortion caused by the high-powered filter 134. The linear equalizer 114 may be comprised, or include, a microprocessor that performs a process and/or may be comprised of, or include, discrete "hard-wired" circuitry.

The information signal passe from the linear equalizer 114 to the volterra filter 112. The volterra filter 112 may have any suitable structure for pre-distorting (e.g., pre-equalizing) the signal to compensate for both the non-linear distortion caused by a power amplifier 102, and pre-amp linear distortion. The volterra filter 112 may be comprised of, or include, a microprocessor that performs a program process and/or may be comprised or include, discrete "hard-wired" circuitry.

In the example of FIG. 6, the pre-amp processing circuitry 104 and upconverter 11 includes a first upconverter 136 driven by a first local oscillator 138, a first bandpass filter 140, a second upconverter 142 driven by a second local oscillator 144, a second bandpass filter 146, and a third bandpass filter 148. In addition a fourth bandpass filter 150 is located just downstream of the power amplifier 102. The volterra filter 112 also corrects the distortion from the fourth bandpass filter 150.

The output of the volterra filter 112 is provided to an interpolation component 152. Preferably, the interpolation that occurs is a factor of two. The DAC 108 receives the output of the interpolation component 152 and provides the signal to the first upconverter 136.

For the adaptation of the volterra filter 112, the sample 120 is taken after the power amplifier 102 and after the fourth bandpass filter 150, but prior to the high-power filter 134. Along the path of the sample is located a first downconverter 154, a first low-pass filter 156, a second downconverter 158, and a second low-pass filter 160. Additionally, an analog-to-digital converter (A/D) 162 and a decimation (i.e., by two) function component 164 are located to provide the input to the correction determination function block 116 for the volterra filter 112.

The sample 126 for the linear equalizer correction determination 122 for the linear equalizer 114 is operatively connected to the output of the high-power filter 134. Similar to the sample path for the volterra filter correction determination 116, the path for the linear equalizer correction determination 122 includes suitable components 168 for down-converting, filtering, decimation, and the like.

From the above description of the invention, those skilled in the art will perceive improvements, changes and modifications. For example, other types of components could be used in place of the volterra filter. Examples of such components with non-linear components are perceptrons and neural networks. The modeling of such other non-linear components may be logarithmic, curve fitting, or the like. Such improvements, changes and modifications within the skill of the art are intended to be covered by the appended claims.

Having described the invention, the following is claimed:

1. A digital broadcast transmission system comprising:

signal provision means for providing an electrical information-conveying signal;

antenna means for emitting a broadcast signal that conveys the contents of the information signal;

amplifier means for amplifying the information signal to a power level suitable to excite said antenna means to emit the broadcast signal, said amplifier means causing non-linear distortion to the information signal;

signal processing means for processing the information signal, including filter means for filtering the information signal, said signal processing means causing linear distortion to the information signal; and a single volterra filter for pre-distorting the information signal to compensate for the linear and non-linear distortions.

2. A system as set forth in claim 1, wherein said filter means includes a pre-amp filter located upstream of said amplifier means and a post-amp filter located downstream of said amplifier means, said pre-amp filter, said amplifier means, and said post-amp filter cause distortion to the information signal in a sequence of linear, non-linear, and linear.

3. A system as set forth in claim 1, wherein said corrector is located upstream of said filter means and said amplifier means.

4. A digital broadcast transmission system comprising:

signal provision means for providing an electrical information-conveying signal along a signal stream;

antenna means, located at the end of the signal stream, for emitting a broadcast signal that conveys the contents of the information signal;

a plurality of components located along the signal stream between said signal provision means and said antenna means, said plurality of components causing distortion to the information signal, at least one of said plurality of components causing linear distortion to the information signal and at least one of said plurality of components causing non-linear distortion to the information signal; and a single volterra filter for pre-distorting the information signal to compensate for all of the distortion caused by said plurality of components.

5. A system as set forth in claim 4, wherein said plurality of components includes an amplifier, a pre-amp filter located upstream of said amplifier, and a post-amp filter located downstream of said amplifier, said pre-amp filter, said amplifier, and said post-amp filter cause distortion to the information signal in a sequence of linear, non-linear, and linear.

6. A system as set forth in claim 4, wherein said corrector is located upstream of said pre-amp filter, said amplifier, and said post-amp filter.

7. A system as set forth in claim 4, including another component located along the signal stream between said signal provision means and said antenna means, said other component causing linear distortion to the information signal, and another corrector for pre-distorting the information signal to compensate for the distortion caused by said other component.

8. A system as set forth in claim 7, wherein said other component includes a high-power filter.

9. A method of transmitting a broadcast signal from a digital transmitter, said method comprising:

providing an information signal in digital format;

converting the information signal to analog format;

amplifying the analog in formation signal, said step of amplifying includes causing non-linear distortion to the information signal;

filtering the analog information signal prior to said step of amplifying, said step of filtering prior to amplifying includes causing linear distortion to the information signal;

filtering the analog information signal after said step of amplifying, said step of filtering after amplifying includes causing linear distortion to the information signal; and correcting the linear and non-linear distortion in a single corrector.

10. A method as set forth in claim 9, wherein said step of correction includes determining a pre-distortion to be imposed onto the information signal.

11. A method as set forth in claim 10, wherein said step of determining a pre-distortion includes initially abstaining from imposing a pre-distortion onto the information signal and determining distortion caused by said steps of amplifying and filtering.

* * * * *